United States Patent [19]

Benjamin et al.

[11] Patent Number: 4,635,084
[45] Date of Patent: Jan. 6, 1987

[54] SPLIT ROW POWER JFET

[75] Inventors: James A. Benjamin, Waukesha, Wis.; Robert W. Lade, Fort Myers, Fla.; Herman P. Schutten, Milwaukee, Wis.

[73] Assignee: Eaton Corporation, Cleveland, Ohio

[21] Appl. No.: 618,432

[22] Filed: Jun. 8, 1984

[51] Int. Cl.$^4$ ............................................. H01L 29/80
[52] U.S. Cl. ...................................... 357/22; 357/20; 357/41; 357/55; 307/571
[58] Field of Search ................ 357/20, 22, 39, 55, 357/41; 307/571, 581

[56] References Cited

U.S. PATENT DOCUMENTS

| | | | |
|---|---|---|---|
| 2,666,814 | 1/1954 | Shockley | 357/22 |
| 2,790,037 | 4/1957 | Shockley | 357/22 |
| 2,820,154 | 1/1958 | Kurshaw | 357/22 |
| 2,989,713 | 6/1961 | Warner | 357/55 |
| 3,005,937 | 10/1961 | Wallmark et al. | 357/22 |
| 3,035,186 | 5/1962 | Doucette | 357/22 |
| 3,054,034 | 9/1962 | Nelson | 357/22 |
| 3,126,505 | 3/1964 | Shockley | 357/55 |
| 3,128,530 | 4/1964 | Rouse et al. | 357/22 |
| 3,274,461 | 9/1960 | Teszner | 357/22 |
| 3,354,362 | 11/1967 | Zuleeg | |
| 3,372,316 | 3/1968 | Teszner | 357/22 |
| 3,497,777 | 2/1970 | Teszner | 357/22 |
| 3,975,752 | 8/1976 | Nicolay | 357/22 |
| 4,254,430 | 3/1981 | Beneking | 357/22 |
| 4,270,059 | 5/1981 | Nishizawa et al. | 357/22 |
| 4,288,800 | 9/1981 | Yoshida et al. | 357/22 |
| 4,343,015 | 8/1982 | Baliga et al. | 357/55 |
| 4,463,366 | 7/1984 | Ishii et al. | 357/22 |
| 4,482,907 | 11/1984 | Jay | 357/22 |

FOREIGN PATENT DOCUMENTS

| | | |
|---|---|---|
| 0053854 | 6/1982 | European Pat. Off. |
| 0083815 | 7/1983 | European Pat. Off. |
| 3345189 | 6/1984 | Fed. Rep. of Germany |
| 1377330 | 9/1964 | France |
| 2152656 | 4/1973 | France |
| 2454703 | 11/1980 | France |
| 54-151380 | 11/1979 | Japan ................................. 357/55 |

OTHER PUBLICATIONS

"Simultaneous Modulation of Electron and Hole Conductivity in a New Periodic GaAs Doping Multilayer Structure", K. Ploog et al. Applied Physics Letters, vol. 38, No. 11, Jun. 1981, pp. 870–873, New York.

Primary Examiner—Joseph E. Clawson, Jr.
Attorney, Agent, or Firm—Andrus, Sceales, Starke & Sawall

[57] ABSTRACT

A power JFET (2) has a common drift region (4) between split first and second longitudinally separated sets of rows (6, 8) of alternating conductivity type layers (10-20 and 21-31) forming a plurality of channels (11, 13, 15, 17, 19, 22, 24, 26, 28 and 30). The JFET has an ON state conducting bidirectional current horizontally longitudinally through the common drift region and the channels. The JFET has an OFF state blocking current flow through the channels due to horizontally lateral depletion pinch-off. The layers of the rows extend vertically and horizontally longitudinally such that the direction of layering extends horizontally laterally. Particular gate structure is disclosed.

3 Claims, 6 Drawing Figures

U.S. Patent    Jan. 6, 1987    4,635,084
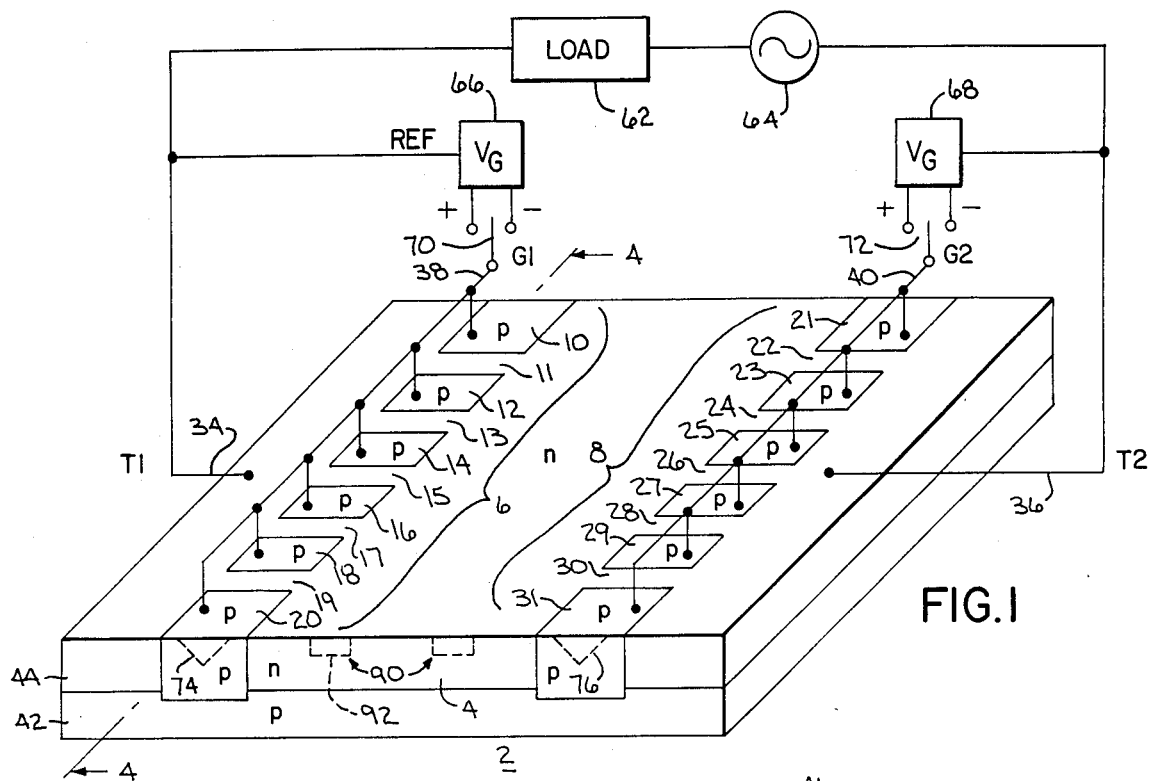
FIG. 1
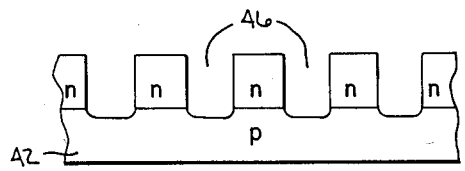
FIG. 2
FIG. 3
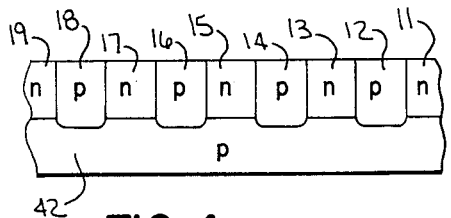
FIG. 4
FIG. 5
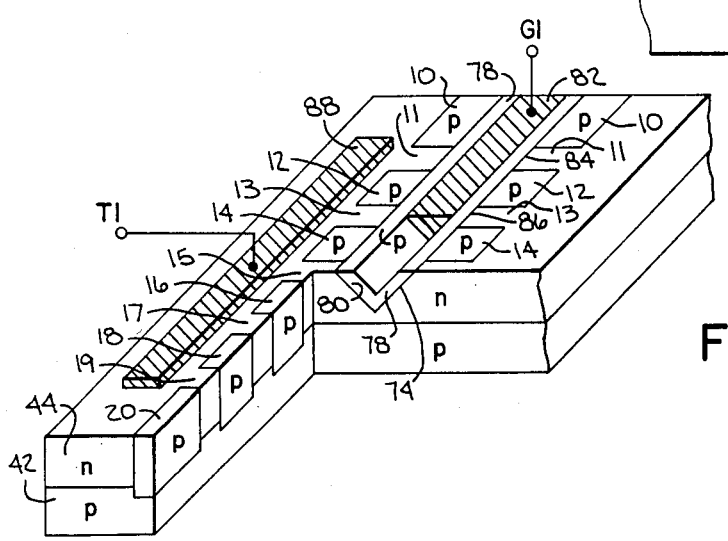
FIG. 6

SPLIT ROW POWER JFET

BACKGROUND AND SUMMARY

The invention relates to a junction field effect transistor (JFET) affording high blocking voltage capability, including AC application.

A power JFET is provided having a common drift region between split first and second sets of rows of alternating conductivity type layers forming a plurality of channels. Bidirectional current is conducted horizontally longitudinally through the channels and the common drift region in an ON state. Multiple channels reduce the channel component of the ON state resistance. In the OFF state, current flow is blocked by horizontally lateral depletion region spreading and pinch-off in the channels.

Linear geometry enables desirable control of breakdown voltage, and in turn a higher blocking voltage capability. Conduction current through the common drift region affords desirable bulk effect characteristics.

BRIEF DESCRIPTION OF THE DRAWINGS

FIG. 1 is a schematic isometric view showing power JFET structure constructed in accordance with the invention.

FIGS. 2-4 are sectional views taken along line 4—4 of FIG. 1, and illustrate sequential processing steps for forming the structure of the invention.

FIG. 5 is an enlarged isolated section of FIG. 1 illustrating a conduction channel, and depletion pinch-off.

FIG. 6 is an enlarged isometric illustration of a portion of FIG. 1 showing the preferred gate terminal structure.

DETAILED DESCRIPTION

FIG. 1 shows a power JFET 2 having a common drift region 4 between split first and second sets of rows 6 and 8 of alternating conductivity type layers such as 10-20 and 21-31 forming a plurality of channels such as 11, 13, 15, 17, 19, 22, 24, 26, 28 and 30. JFET 2 has an ON state conducting bidirectional current horizontally longitudinally through common drift region 4 and the noted channels. JFET 2 has an OFF state blocking current flow through the channels due to horizontally lateral depletion region spreading and pinch-off. First and second sets of rows 6 and 8 are longitudinally split and separated by common drift region 4 therebetween. The layers 10-20 and 21-31 of the sets of rows extend vertically and horizontally longitudinally such that the direction of layering extends horizontally laterally.

Drift region 4 and the noted channels, such as 11, 13, 15, 17, 19, 22, 24, 26, 28 and 30, are of one conductivity type, such as n type. First main terminal means T1, described in greater detail hereinafter in connection with FIG. 6, is connected to the channels such as 11, 13, 15, 17 and 19 in the first set of rows 6, as shown at 34 in FIG. 1. Second main terminal means T2 is connected to the channels such as 22, 24, 26, 28 and 30 in the second set of rows 8, as shown at 36. First gate terminal means G1 is connected to the other conductivity type layers such as p layers 10, 12, 14, 16, 18 and 20 in first set of rows 6, as shown at 38. Second gate terminal means G2 is connected to the other conductivity type layers such as p layers 21, 23, 25, 27, 29 and 31 in second set of rows 8, as shown at 40.

Referring to FIGS. 2-4, the formation of JFET 2 is initiated with a substrate such as p type layer 42, followed by epitaxial growth of n type layer 44 which will eventually provide the common drift region 4 and the channels. A plurality of notches such as 46, FIG. 3, are then formed by anisotropic etching, plasma etching, or other suitable means, as known in the art: C. Hu, "A Parametric Study Of Power MOSFETs", IEEE Electron Device Conference, Paper CH1461-3/79, 0000-0385; IEEE Electron Devices, Volume Ed.-25, No. 10, October, 1978; and Ammar and Rogers, "UMOS Transistors On Silicon", Transactions IEEE, Ed.-27, Pages 907-914, May, 190. Alternatively, the notches may be formed by a porous silicon region in accordance with the known anodization technique of passing a fixed current through the localized region in the presence of concentrated hydrogen flouride to create a structural change in the silicon which remains single crystalline with the substrate but becomes porous. The notches then etch at a much faster rate. A p deposition in the notches yields the structure of FIG. 4, taken along line 4—4 of FIG. 1, with alternating conductivity type layers 11-19 and so on of the first set of rows 6.

Referring to FIG. 5, depletion region spreading from the junctions such as 50 and 52 between the layers of the stacks cause the noted pinch-off OFF state. When the depletion region spreading rightwardly from junction 50 meets the depletion region spreading leftwardly from junction 52, as shown at interface dashed line 54, channel 13 is pinched OFF. In this OFF state, current cannot flow through channel 13 into or out of the page in the orientation of FIG. 5, which is horizontally longitudinal in the orientation of FIG. 1. The depletion region spreading direction in FIG. 5 is left-right, which is horizontally lateral in FIG. 1.

Depletion region shrinking toward the junctions between the layers in the sets of rows enables the noted ON state. For example, in FIG. 5, depletion region shrinking leftwardly toward junction 50, as shown at dashed line 56, and depletion region shrinking rightwardly toward junction 52, as shown at 58, opens a conductive region of width 60 through channel 13. Current may flow into or out of the page in FIG. 5, which is horizontally longitudinal through the channels in FIG. 1.

FIG. 1 shows power JFET 2 connected in an AC load line, including load 62 and AC power source 64. In the ON state, during the first half cycle of AC source 64, current flows rightwardly through JFET 2, namely from left main terminal T1 through conduction channels 11, 13, 15, 17 and 19, through common drift region 4, through conduction channels 22, 24, 26, 28 and 30, to right main terminal T2, to complete a circuit through load 62. In the other half cycle of AC source 64, current flows leftwardly through JFET 2, namely from right main terminal T2, through conduction channels 22, 24, 26, 28 and 30, through common drift region 4, through conduction channels 11, 13, 15, 17 and 19, to left main terminal T1.

In the preferred embodiment, JFET 2 is normally OFF. The depletion regions from p layers such as 12 and 14, FIG. 5, normally extend toward and meet each other, as at 54, in the absence of bias on the gate terminals, such that the channels such as 13 are normally pinched OFF. JFET 2 is turned ON by biasing gate terminals G1 and G2 to shrink the depletion regions and open conductive channels, such as 60, FIG. 5, such that current can flow between main terminals T1 and T2.

Gating voltage sources 66 and 68 are referenced to respective main terminals T1 and T2 and provide the relatively positive gate bias when respective switches 70 and 72 are in their leftward position. Referring to FIG. 5, junctions 50 and 52 are then forward biased, and the depletion regions in layer 13 shrink toward the junctions to open the conductive channel of width 60. In one form of this embodiment, affording a device blocking 1,000 volts in the OFF state, the horizontal length of common drift region 4 between sets of rows 6 and 8 is about 60 microns. The lateral horizontal width of the n type channel layers such as 13 is about 3000 to 5000 angstroms. The lateral horizontal width of the p layers such as 12 is arbitrary according to processing. The n type regions have a concentration of about $10^{14}$ or $10^{15}$ atoms per cubic centimeter, and the concentration of the p type regions is about $10^{17}$ or $10^{18}$ atoms per cubic centimeter.

In an alternate embodiment, JFET 2 is normally ON. The depletion regions from the p type layers, such as 12 and 14 in FIG. 5, normally extend only partially towards each other, as shown at 58 and 56, in the absence of gate bias, to leave open conductive channel 13, as shown at 60, such that current can flow between main terminals T1 and T2. JFET 2 is turned OFF by biasing first and second gate terminals G1 and G2 to spread the depletion regions and pinch-off the channels, as shown at 54, FIG. 5. With switches 70 and 72 in their rightward position, a relatively negative gate bias is applied, to thus reverse bias the junctions between the layers in the sets of rows 6 and 8. For example, reverse biasing of junctions 50 and 52, FIG. 5, spreads the depletion regions to pinch-off the channel, as shown at 54.

Referring to FIG. 6, a first groove 74 is notched vertically into first set of rows 6. Groove 74 may be V-shaped or U-shaped, and formed by the above noted anisotropic etching, plasma etching, or other suitable means. A second groove is formed in second set of rows 8. These grooves are shown at dashed lines 74 and 76 in FIG. 1.

The first gate terminal means is in first groove 74 and connected to the other conductivity type layers, such as p layers 10, 12, 14, 16, 18 and 20, in first set of rows 6. The first gate terminal means includes a first gate layer of semiconductor material of the other conductivity type, such as p layer 78, extending along the inner surface 80 of groove 74 to contact p layers 10, 12, 14, 16, 18 and 20. The first gate terminal means also includes a first gate electrode 82 contacting first gate layer 78. Groove 74 extends horizontally laterally and transversely across the layers 10–20 of first set of rows 6.

P type gate layer 78 is contiguous with and forms a plurality of interface junctions such as 84 and 86 along the channels such as 11 and 13 in the first set of rows 6. The last mentioned junctions such as 84 and 86 have a forward voltage drop thereacross great enough to prevent shorting of junctions such as 50 and 52, FIG. 5, between the layers of set of rows 6. This ensures a sufficient voltage differential across the channel junctions such as 50 and 52 to enable depletion region shrinking toward the junctions such as 50 and 52, enabling the noted ON state. The voltage drop across the groove junctions such as 84 and 86 and across the channel junctions such as 50 and 52 is typically about 0.7 volts, due to the noted carrier concentrations, which are likewise used for p layer 78.

The left main terminal means is provided by an electrode 88 contacting layer 44 to thus be connected to channels 11, 13, 15, 17 and 19 in the left set of rows 6. Electrodes 82 and 88 are preferably aluminum or polysilicon. The right gate electrode structure in right groove 76 and the right main terminal means are repsectively comparable.

Field shaping means 90, FIG. 1, is provided in common drift region 4 and is removed from the active area of the channel junctions between the layers of sets of rows 6 and 8. Field shaping means 90 includes one or more regions such as shown in dashed line at 92 of the noted other conductivity type, such as p type, for straightening field lines in drift region 4 and reducing gradient curvature crowding of the field lines, whereby to increase blocking voltage capability. In preferred form, field shaping means 90 is provided by one or more floating depletion regions such as 92 not tied to any source of bias potential. Depletion region 92 is vertically opposed to a portion of p type substrate 42 and provides the noted field shaping by straightening field lines in drift region 4 therebetween. P region 92 extends horizontally laterally across layer 44 and may be formed during the p deposition of regions 10, 12 and so on.

It is recognized that various modifications are possible within the scope of the appended claims.

We claim:

1. A bidirectional power JFET for AC operation comprising:

a semiconductor substrate of one conductivity type comprising a thin flat wafer lying in a horizontal plane and having top and bottom horizontal major surfaces;

a left set of a plurality of layers of alternating conductivity type semiconductor material each extending vertically up-down and horizontally left-right, said layers being layered in a horizontal forward-rearward direction to provide a first forward-rearward row in said substrate, the layers of said one conductivity type defining a plurality of horizontal left-right channels interdigitated with layers of the other conductivity type and forming a plurality of respective interface channel junctions therewith, said channel junctions extending vertically up-down and horizontally left-right;

a right set of a plurality of layers of alternating conductivity type semiconductor material each extending vertically up-down and horizontally left-right in said substrate, said layers being layered in a horizontal forward-rearward direction of layering to provide a second forward-rearward row in said substrate, the layers of said one conductivity type defining a plurality of horizontal left-right channels interdigitated with layers of the other conductivity type and having a plurality of respective interface channel junctions therewith, each said channel junction extending vertically up-down and horizontally left-right;

a common drift region of said one conductivity type in said substrate between said left and right rows;

first main terminal means operatively coupled to the left ends of said channels in said left row;

second main terminal means operatively coupled to the right ends of said channels in said right row;

a source of alternating voltage impressed across said first and second main terminal means;

first gate terminal means operatively coupled to said other conductivity type layers in said left row;

second gate terminal means operatively coupled to said other conductivity type layers in said right row;

first gate voltage bias means connected to said first gate terminal means and applying a gating bias potential to said other conductivity type layers in said left row, such that for a first polarity of said first gate bias means, said channel junctions of said left row are forward biased and depletion regions therearound shrink horizontally forward-rearward toward said channel junctions to open a conductive horizontal left-right current path through said channels between said first main terminal means and said common drift region, and such that for a second polarity of said first gate bias means, said channel junctions of said left row are reverse biased and depletion regions therearound expand horizontally forward-rearward away from said channel junctions to close said horizontal left-right current paths and block conduction between said first main terminal means and said common drift region;

second gate voltage bias means connected to said second gate terminal means and applying a gating bias potential to said other conductivity type layers of said right row, such that for a first polarity of said second gate bias means, said channel junctions of said right row are forward biased and depletion regions therearound shrink horizontally forward-rearward toward said channel junctions to open a conductive horizontal left-right current path through said channels between said second main terminal means and said common drift region, and such that for a second polarity of said second gate bias means, said channel junctions of said right row are reverse biased and depletion regions therearound expand horizontally forward-rearward away from said channel junctions to close said horizontal left-right current path and block conduction between said second main terminal means and said common drift region, wherein:

said first gate terminal means is connected both to said other conductivity type layers in said left row and to said one conductivity type layers in said left row forming said channels;

said first gate bias means is referenced to said first main terminal means;

said second gate terminal means is connected both to said other conductivity type layers in said right row and to said one conductivity type layers in said right row forming said channels;

said second gate bias means is referenced to said second main terminal means; and comprising means preventing electrical shorting of said first gate terminal means to said one conductivity type layers in said left row when said channel junctions of said left row are forward biased and said first gate bias means is at said first polarity; and comprising means preventing electrical shorting of said second gate terminal means to said one conductivity type layers in said right row when said channel junctions of said right row are forward biased and said second gate bias means is at said first polarity.

2. The invention according to claim 1 comprising a first forward-rearward groove notched vertically into said left row and extending forward-rearward across said alternating conductivity type layers of said left row, and wherein said first gate terminal means is in said first groove and comprises a first gate electrode and a semiconductor layer of said other conductivity type, said first gate electrode contacting said last mentioned semiconductor layer, said last mentioned semiconductor layer extending forward-rearward across and contacting said one and said other conductivity type layers of said left row, and comprising a second forward-rearward groove notched vertically into said right row and extending forward-rearward across said alternating conductivity type layers of said right row, and wherein said second gate terminal means is in said second groove and comprises a second gate electrode and a semiconductor layer of said other conductivity type, said second gate electrode contacting said last mentioned semiconductor layer, said last mentioned semiconductor layer extending forward-rearward across and contacting said one and said other conductivity type layers of said right row.

3. The invention according to claim 2 wherein:

said first main terminal means comprises first main electrode means contacting said substrate leftwardly of said left row; and said second main terminal means comprises second main electrode means contacting said substrate rightwardly of said right row.

* * * * *